United States Patent [19]

Haque

[11] 4,441,082

[45] Apr. 3, 1984

[54] SWITCHED CAPACITOR AUTOMATIC GAIN CONTROL LOOP

[75] Inventor: Yusuf A. Haque, San Jose, Calif.

[73] Assignee: American Microsystems, Inc., Santa Clara, Calif.

[21] Appl. No.: 310,160

[22] Filed: Oct. 9, 1981

[51] Int. Cl.³ .............................................. H03G 3/10
[52] U.S. Cl. ..................................... 330/129; 330/279
[58] Field of Search ................. 330/86, 129, 134, 278, 330/279, 282; 328/26; 307/262

[56] References Cited

U.S. PATENT DOCUMENTS 4,360,787 11/1982 Galpin .................................. 330/279

FOREIGN PATENT DOCUMENTS 56-58306 4/1981 Japan .
1342383 1/1974 United Kingdom .
1513126 6/1978 United Kingdom .

OTHER PUBLICATIONS

Allstot et al. "An Electrically-Programmable Switched Capacitor Filter" IEEE Journal of Solid-State Circuits, vol. SC. 14, No. 6, Dec. 1979, pp. 1034–1041.
Baldwin et al. "An MOS Digitally Controlled Analog Attenuator for Voiceband Signals" IEEE Journal of Solid State Circuits, vol. SC-14, No. 1, Feb. 1979.
Anon "Analogue Switches as C.M.O.S. Circuit Building Blocks" New Electronics, vol. 9, No. 2, pp. 20, 24–25, Jan. 27, 1976.
Larsen et al. "An Improved Receiver for Baseband Data Communication Using a Digitally Controlled AGC" Int. Journal of Elect. 1977, vol. 43, No. 6, pp. 593–598.

Primary Examiner—James B. Mullins
Assistant Examiner—Gene Wan
Attorney, Agent, or Firm—Alan H. MacPherson; Steven F. Caserza; Richard Franklin

[57] ABSTRACT

An AGC circuit (12) contains a programmable gain stage comprising an operational amplifier (150) and one or more capacitor arrays (101, 121) for controlling the closed loop gain of the operational amplifier. The output signal ($V_O$) of this operational amplifier is rectified, and the rectified signal is alternately integrated with a reference voltage ($V_{ref}$) of opposite polarity to the rectified AGC signal. The polarity of the integrated voltages operates a counter stage (200). The output bits ($0_2$–$0_N$) of the counter are used to control switches (134-2 through 134-N, 135-2 through 135-N, 110-2 through 110-N, 111-2 through 111-N) in the one or more capacitor arrays which control the closed loop gain of the operational amplifier of the AGC circuit of this invention.

13 Claims, 6 Drawing Figures

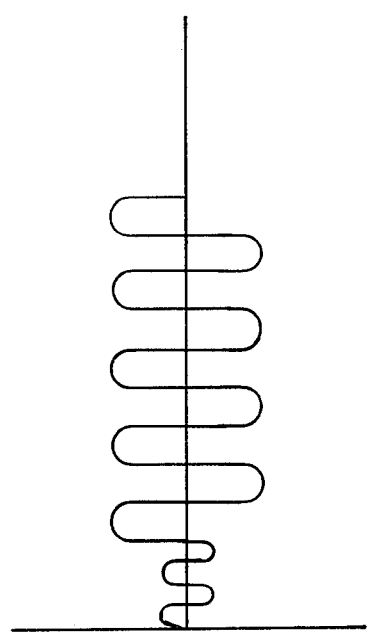
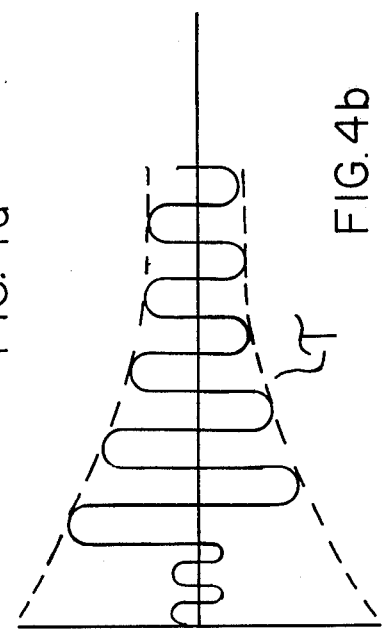

SWITCHED CAPACITOR AUTOMATIC GAIN CONTROL LOOP

FIELD OF THE INVENTION

This invention relates to automatic gain control circuits, and more specifically to an automatic gain control circuit utilizing switched capacitors which is capable of being implemented as a monolithic integrated circuit device.

BACKGROUND OF THE INVENTION

Automatic gain control (AGC) circuits are well-known in prior art. Such automatic gain control circuits operate to provide an output signal having a relatively fixed amplitude despite wide variations in input signal amplitudes. Such AGC circuits have been used for many years in, for example, radio receivers and audio equipment, as well as in many other applications. With the advent of integrated circuit technology, attempts have been made to integrate AGC circuits on a single monolithic integrated circuit chip. However, prior art circuits were unable to fully integrate an AGC circuit on a single integrated circuit chip utilizing metal oxide silicon field-effect transistors (MOSFETs) due to the requirement that one or more MOSFETs have closely controlled tolerances. The formation of highly reproducable MOSFET devices on a single integrated circuit chip is difficult, and thus prior art AGC circuits utilizing MOSFET devices require at least one discrete MOSFET device connected externally to the remainder of the integrated circuit chip.

SUMMARY

In accordance with this invention, an AGC circuit utilizing MOS devices and switched capacitor technology is fabricated on a single semiconductor chip. The AGC circuit constructed in accordance with this invention contains a programmable gain stage comprising an operational amplifier and one or more capacitor arrays for controlling the closed loop gain of the operational amplifier. The gain of the operational amplifier is automatically controlled to produce an output signal of desired amplitude. The output signal of this operational amplifier is rectified, and the rectified signal (hereinafter referred to as the "rectified AGC signal") is integrated utilizing an integrator stage of well-known design. A reference voltage of opposite polarity to the rectified AGC signal is also integrated on the integrator stage and the output signal of the integrator is compared to ground, thereby obtaining the sign bit of the output signal of the integrator stage. The sign bit indicating the polarity is stored in a latch, and is used to operate a counter stage, with the counter stage increasing its count by one count during each clock period in which the sign bit is a logical zero, corresponding to a period when the amplitude of the output signal of the AGC circuit is higher than desired. Similarly, the counter stage decreases its count by one count during each clock period when the sign bit is a logical one, corresponding to a period when the amplitude of the output signal of the AGC circuit is lower than desired. The output bits of the counter are used to control switches in the one or more capacitor arrays which control the closed loop gain of the operational amplifier of the AGC circuit of this invention.

Thus, when the magnitude of the output signal from the AGC circuit of this invention is less than desired, the sign bit will be equal to one, thereby causing the counter to count down, thereby controlling the capacitors in the one or more capacitor arrays so as to decrease the closed loop gain of the operational amplifier. On the other hand, if the amplitude of the AGC output signal is greater than desired, the sign bit will be equal to zero, thereby causing the counter to count up, thereby controlling the capacitors in the one or more capacitor arrays so as to increase the closed loop gain of the operational amplifier. When the AGC circuit of this invention has stabilized, the sign bit will toggle between one and zero during alternate clock periods, thus causing the counter to alternately count up and down, thereby in effect continuously toggling the binary output signal from the counter by one. This causes the capacitors in the one or more capacitor arrays to be controlled in such a manner as to cause the closed loop gain of the operational amplifier to toggle between two closely related values, thereby providing an output signal of relatively constant amplitude, as desired.

In one embodiment of this invention, several of the least significant bits of the counter are not used to control switches in the capacitor arrays, thus eliminating changes in the closed loop gain of the operational amplifier, due to noise, thus resulting in slower AGC circuit having a longer response time.

Another embodiment of this invention utilizes a plurality of capacitors which are selectively connected to the integration stage, thereby providing a plurality of possible response times of the AGC circuit.

BRIEF DESCRIPTION OF THE DRAWINGS

FIG. 4a is a graphical representation of an input signal to the automatic gain control circuit constructed in accordance with this invention.

FIG. 4b is a graphical representation of the output signal from the automatic gain control circuit constructed in accordance with this invention in response to the input signal of FIG. 4a.

DETAILED DESCRIPTION

Figure 1:
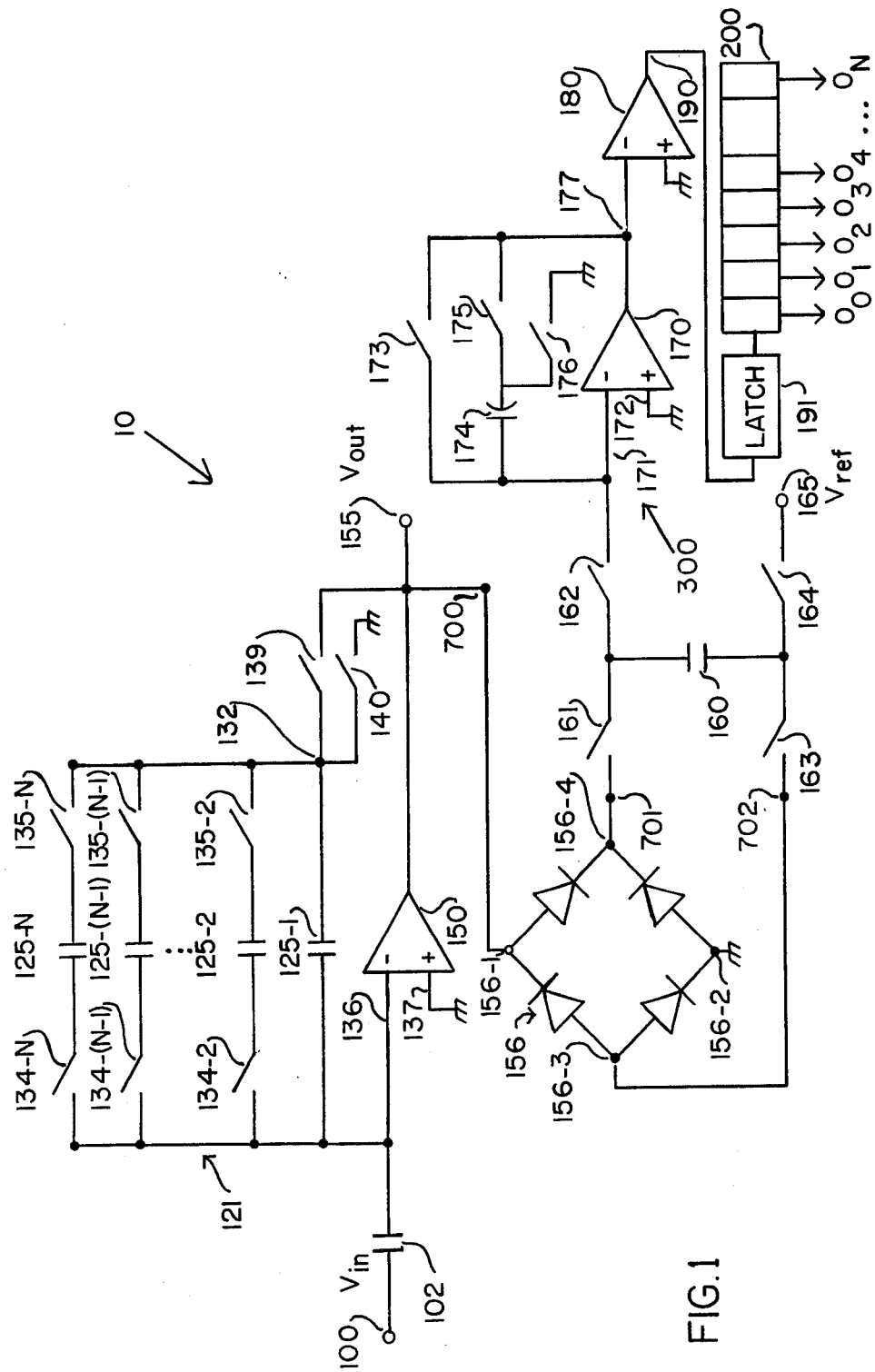
FIG. 1 is a schematic diagram of an automatic gain control circuit constructed in accordance with this invention.

The automatic gain control circuit of this invention will be easily understood in conjunction with FIG. 1. The automatic gain control circuit 10 includes operational amplifier 150 constructed in a well-known manner. The non-inverting input lead 137 of operational amplifier 150 is connected to ground, although it is to be understood that non-inverting input lead 137 may be connected to any suitable reference voltage. Capacitor 102 is connected between input terminal 100, to which the input voltage to be controlled ($V_{IN}$) is applied, and inverting input lead 136 of operational amplifier 150. Capacitor array 121 is connected between inverting input lead 136 and output terminal 155 of operational amplifier 150, thereby providing negative feedback.

Capacitor 102 and capacitor array 121 operate in a well-known manner to control the closed loop gain of operational amplifier 150. The closed loop gain $G_1$ of operational amplifier 150 is equal to $$G_1 = -C_{102}/C_{121} \qquad (1)$$

where $G_1$ = the closed loop gain of operational amplifier 150;
$C_{102}$ = the capacitance of capacitor 102; and
$C_{121}$ = the effective capacitance of capacitor array 121, as determined by the operation of switches 134-2 through 134-N and 135-2 through 135-N.

Capacitor array 121 comprises a plurality of N capacitors 125-1 through 125-N connected between inverting input lead 136 and output terminal 155 of operational amplifier 150. Capacitors 125-2 through 125-N of capacitor array 121 are selectively connected in parallel with capacitor 125-1 by the operation of appropriate switches 134-2 through 134-N and 135-2 through 135-N. For example, capacitor 125-2 is connected in parallel with capacitor 125-1 when switches 134-2 and 135-2 are closed, and is disconnected when switches 134-2 and 135-2 are open.

The capacitors 125-1 through 125-N in capacitor array 121 may be equally weighted, such that the capacitance of capacitor array 121 connected between output terminal 155 and lead 136 may be selected in accordance with the following equation:

$$C_{121} = JC_1 \qquad (2)$$

where $C_{121}$ = the effective capacitance of capacitor array 121 connected between output terminal 155 and inverting input lead 136;
$J$ = is a selected integer ranging from 1 to N equal to the number of capacitors of capacitor array 121 which are connected between output terminal 155 and inverting input lead 136; and
$C_1$ = the capacitance of each capacitor 125-1 through 125-N within capacitor array 121.

Alternatively, the capacitors of capacitor array 121 may be binary weighted, such that the weight of each capacitor follows the following equation:

$$C_M = 2^{M-1} C_1 \qquad (3)$$

where $C_M$ = the capacitance of the Mth capacitor; and
$C_1$ = the capacitance of capacitor 125-1, which serves as the first capacitor.

The effective capacitance of binary weighted array 121 is equal to $$C_{121} = KC_1 \qquad (4)$$

where K is an integer ranging from 1 to $(2^N - 1)$, and where N is the number of capacitors in capacitor array 121.

The capacitance values of capacitors 125-1 through 125-N of capacitor array 121 may also be selected in accordance with any other desired weighting scheme including, but not limited to, weighting schemes which allow companding in accordance with the well known $\mu 255$ law specified by documents available from the International Telegraph and Telephone Consultative Committee (CCITT) (Europe) and by the American Telephone and Telegraph Company (AT&T) (USA).

The switches within capacitor array 121 are controlled by the counter 200 in order to select the desired closed loop gain of operational amplifier 150, as will be more fully described later.

The output signal available on output terminal 155 of operational amplifier 150 is rectified by diode bridge 156 and alternately integrated with a reference voltage $V_{ref}$ in integrator stage 300. Rectifier bridge 156 may be replaced with any suitable rectifying means, including a half-wave rectifier comprising a single diode. However, the magnitude of reference voltage $V_{ref}$ must be decreased by approximately 50% if half-wave rectification of output signal $V_0$ is used in place of full-wave rectification. Integrator 300 comprises operational amplifier 170, integrating capacitor 174, and switches 173, 175 and 176.

Figure 5:
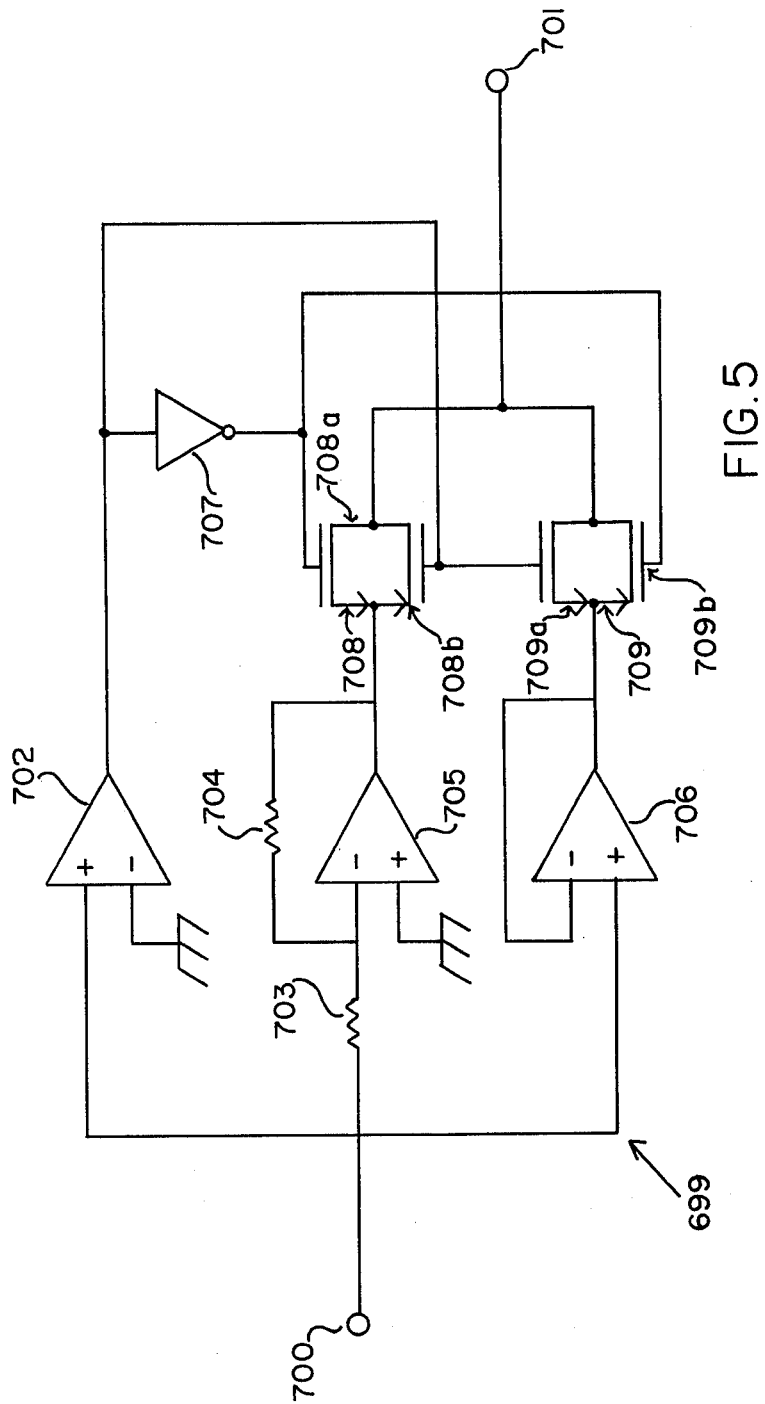
FIG. 5 is a schematic diagram of a circuit which may be utilized as a rectifier in the AGC circuit constructed in accordance with this invention.

Diodes can be fabricated MOS devices, but one terminal of the diode is connected to a supply voltage. Alternatively, transistors may be used in place of the diodes, but transistors have current gain. The circuit of FIG. 5 may be used in place of bridge rectifier 156 (FIG. 1) to rectify the output signal from operational amplifier 150 for application to capacitor 160. Input terminal 700 of rectifier means 699 is connected to node 700 of FIG. 1, and output terminal 701 of rectifier 699 is connected to node 701 of the circuit of FIG. 1. Node 702 of the circuit of FIG. 1 is connected to ground when rectifier 699 is utilized.

Rectifier 699 comprises operational amplifier 702, having its inverting input terminal connected to ground, and its non-inverting input terminal connected to input terminal 700. Thus, operational amplifier 702 functions as a voltage comparator and provides a positive output signal when the input signal applies to terminal 700 is positive. On the other hand, operational amplifier 702 provides a negative output signal when the signal applied to terminal 700 is negative. Operational amplifier 705 has its non-inverting input lead connected to ground, and its inverting input lead connected to input terminal 700 through resistor 703. Negative feedback is provided between the output lead of operational amplifier 705 and the inverting input lead of operational amplifier 705 by resistor 704. Thus, operational amplifier 705 provides on its output lead a voltage of polarity opposite to the voltage $V_0$ applied to terminal 700. Operational amplifier 706, having its inverting input lead connected to its output lead, and its non-inverting input lead connected to terminal 700, serves as a unity-gain amplifier, thus providing a voltage on its output lead which is of the same polarity as the voltage applied to terminal 700.

Transmission gates 708 (comprising N-Channel MOSFET 708a and P-Channel MOSFET 708b) and 709 (comprising N-Channel MOSFET 709a and P-Channel MOSFET 709b serve to couple the desired voltage from the output leads of operational amplifiers 705 and 706 to output terminal 701 of rectifier 699. For example, when the voltage $V_0$ (FIG. 1) applied to terminal 700 is positive, operational amplifier 702 provides a positive voltage on its output lead which is applied to the gates of P-Channel MOSFET 708b and N-Channel MOSFET 709a, thus turning off MOSFET 708b and turning on MOSFET 709a. At the same time, the positive voltage provided on the output lead of operational amplifier 702 is inverted by inverter 707, thus providing a negative voltage on the gates of N-Channel MOSFET 708a and P-Channel MOSFET 709b, thus turning off transistor 708a and turning on transistor 709b. Thus, with a positive input signal on terminal 700, transmission gate 708 is turned off and transmission gate 709 is turned on, thus connecting the positive voltage from unity gain amplifier 706 to terminal 701. On the other hand, with a negative voltage $V_0$ applied to input terminal 700, operational amplifier 702 provides a negative voltage on its output lead, thus causing transmission gate 708 to turn on and transmission gate 709 to turn off. Thus, the voltage available on the output lead of operational amplifier 705, which is of opposite polarity to the input voltage applied to terminal 700, and, therefore, a positive voltage, is made available on output terminal 701. In this manner, the rectifier means 699 of FIG. 5 operates to rectify the input voltage applied to its terminal 700 and provides the rectified voltage on its output terminal 701.

Integrator stage 300 is initialized during power-up of the device, by closing switches 173 and 176, and opening switch 175, thus discharging capacitor 174 to ($V_{off}$−0), where $V_{off}$ is the inherent offset voltage of operational amplifier 170. Switches 176 and 173 then open, and switch 175 closes, thus charging capacitor 174 to zero.

During each integration cycle, the rectified AGC signal is first integrated, followed by the integration of reference voltage $V_{ref}$. During the first half of each integration cycle, the output signal from terminal 155 is rectified by rectifier means 156. Switches 161 and 163 close and switches 162 and 164 open, thereby connecting switched capacitor 160 between nodes 156-3 and 156-4 of rectifier means 156. Thus during the first half of each integration cycle a positive voltage equal in magnitude to the output voltage $V_0$ is stored on capacitor 160. Then, during the second half of each integration cycle, switches 161 and 163 open and switches 162 and 164 close, thus connecting capacitor 160 between inverting input lead 171 of operational amplifier 170 and reference voltage $V_{ref}$. $V_{ref}$ is a negative voltage. Because non-inverting input lead 172 of operational amplifier 170 is grounded, inverting input lead 171 is forced to ground potential. Thus, capacitor 160 is charged to (0−$V_{ref}$), thus integrating (−$V_{ref}$−$V_0$) on integrator stage 300. The output voltage available on node 177 of integrator stage 300 is thus equal $G_2$(−$V_{ref}$−$V_0$), with $$G_2 = (-C_{160}/C_{174}) \qquad (5)$$

where
$G_2$=the closed loop gain of integrator stage 300;
$C_{160}$=the capacitance of capacitor 160; and
$C_{174}$=the capacitance of capacitor 174.

The output voltage of amplifier 170 appearing on node 177 is connected to comparator 180, and compared with ground. The output voltage on output lead 190 of comparator 180 provides a sign bit of the output signal from integrator 300. Thus, if the output voltage of integrator stage 300 is positive, the sign bit of comparator 180 will be a logical one, and if the output voltage from integrator stage 300 is negative, the sign bit from comparator 180 will be a logical zero. The sign bit is stored in latch 191, and controls the operation of counter 200. If the sign bit stored in latch 191 is a logical zero, counter will increase its count by one. On the other hand, if the sign bit stored in latch 191 is a logical one, the counter 200 will decrease its count by one.

Counter 200 contains P bits, available on output leads $O_0, O_1, O_2 \ldots O_P$. The state of each bit (logical 1 or logical 0) of counter 200 control switches in capacitor array 121, thereby controlling the effective capacitance of capacitor array 121. Thus, when counter 200 increases its count, corresponding to receipt of a sign bit which is a logical zero, corresponding to an output voltage $V_0$ which, when rectified by rectifier means 156, is greater in magnitude than the reference voltage $V_{ref}$, selected capacitors in capacitor array 121 are connected in parallel with capacitor 125-1 by the operation of switches 134-2 through 134-N and 135-2 through 135-N, thus increasing the ratio of capacitance of array 121 to the capacitance of capacitor 102, thereby decreasing the closed loop gain of operational amplifier 150, thereby decreasing the amplitude of output voltage $V_0$ available on output terminal 155. As the count provided by counter 200 increases in value, the effective capacitance of capacitor array 121 increases. Therefore, it is preferred that the capacitor of capacitor array 121 having the highest capacitance value (capacitor 125-N) be controlled by the most significant bit ($O_P$) of counter 200, the next largest capacitance value (capacitor 125-(N−1)) be controlled by the next most significant bit ($O_{P-1}$), etc., and the smallest capacitance value (125-2) be controlled by the least significant bit ($O_2$). Thus, switches 134-1 and 135-1 close in response to bit $0_l$ of counter 200 being a logical one, and open in response to bit $0_l$ being a logical zero, where l is an integer ranging from 2 to N.

In a similar fashion, when the count stored in counter 200 decreases, corresponding to receipt of a sign bit which is a logical one, corresponding to an output voltage $V_0$ which, when rectified by rectifier means 156, is lower in magnitude than the reference voltage $V_{ref}$, selected capacitors of capacitor array 121 are disconnected, thus decreasing the effective capacitance of capacitor array 121 connected between inverting input lead 136 and output terminal 155 of operational amplifier 150, thus increasing the closed loop gain of operational amplifier 150.

When the AGC circuit of this invention has stabilized, thereby providing an output signal $V_0$ on output terminal 155 which, when rectified, is essentially equal in magnitude to reference voltage $V_{ref}$, the sign bit available from comparator 180 will toggle positive and negative during alternate integration cycles, thus causing counter 200 to toggle up one count and down one count during alternate integration cycles. This causes the closed loop gain of operational amplifier 150 to toggle between two nearly equal values, thus providing an essentially constant output voltage $V_0$ on output terminal 155, whose amplitude has been controlled by the automatic gain control circuit of this invention. In actual operation, the stabilized output voltage, when rectified, will first be slightly greater in magnitude than the reference voltage $V_{ref}$, thus causing the counter 200 to increase its count by one, thus decreasing slightly the closed loop gain of operational amplifier 150. Then, the output voltage, when rectified, will be slightly lower in magnitude than the reference voltage $V_{ref}$, thus causing the counter 200 to decrease its count by one, thus increasing slightly the closed loop gain of operational amplifier 150. Thus, when the AGC circuit of this invention is stabilized, the counter 200 toggles up one count and down one count on alternate integration cycles. This toggling causes an associated toggling of the closed loop gain of operational amplifier 150. However, the change in the closed loop gain of operational amplifier 150 due to this single count toggling during stability is sufficiently small as to result in an output signal $V_0$ of substantially constant amplitude.

The switches 110–115, 130–135, 161–164, 173, 175 and 176 may comprise any suitable switch means and, when the invention is utilized to construct an AGC circuit comprising MOSFET elements, preferably comprise single MOSFET devices. The frequency of operation of switches 161 through 164 (associated with switched capacitor 160 and integrator 170) and counter 200 is capable of being chosen over a wide range of values, depending on the bandwidth of the output signal $V_0$. In one embodiment, the automatic gain control circuit of this invention is used to control the amplitude of audio signals utilized in a modem, and the frequency of operation of the automatic gain control circuit of this invention is approximately 10 to 100 kilohertz. Of course, other frequencies of operation may be used in accordance with the principles of this invention.

In one embodiment of this invention, three additional least significant bits $0_{-1}$, $0_0$, $0_1$ not shown) are provided by counter 200 which are not utilized in controlling switches within capacitor array 101 and 121, thereby minimizing changes in the closed loop gain of operational amplifier 150 due to noise effects. In this embodiment the counter 200 must count down eight counts in order to increase the closed loop gain of operational amplifier 150, and thus increase the amplitude of the output voltage $V_{out}$. Similarly, the counter 200 must count up eight counts in order to decrease the closed loop gain of operational amplifier 150, and thus decrease the amplitude of the output voltage $V_{out}$. Thus, transient noise effects on the output signal $V_0$ will have minimal effect on the closed loop gain of operational amplifier 150, thereby preventing undesired changes in the amplitude of the output signal $V_0$ in response to short duration transient noise signals.

Figure 2:
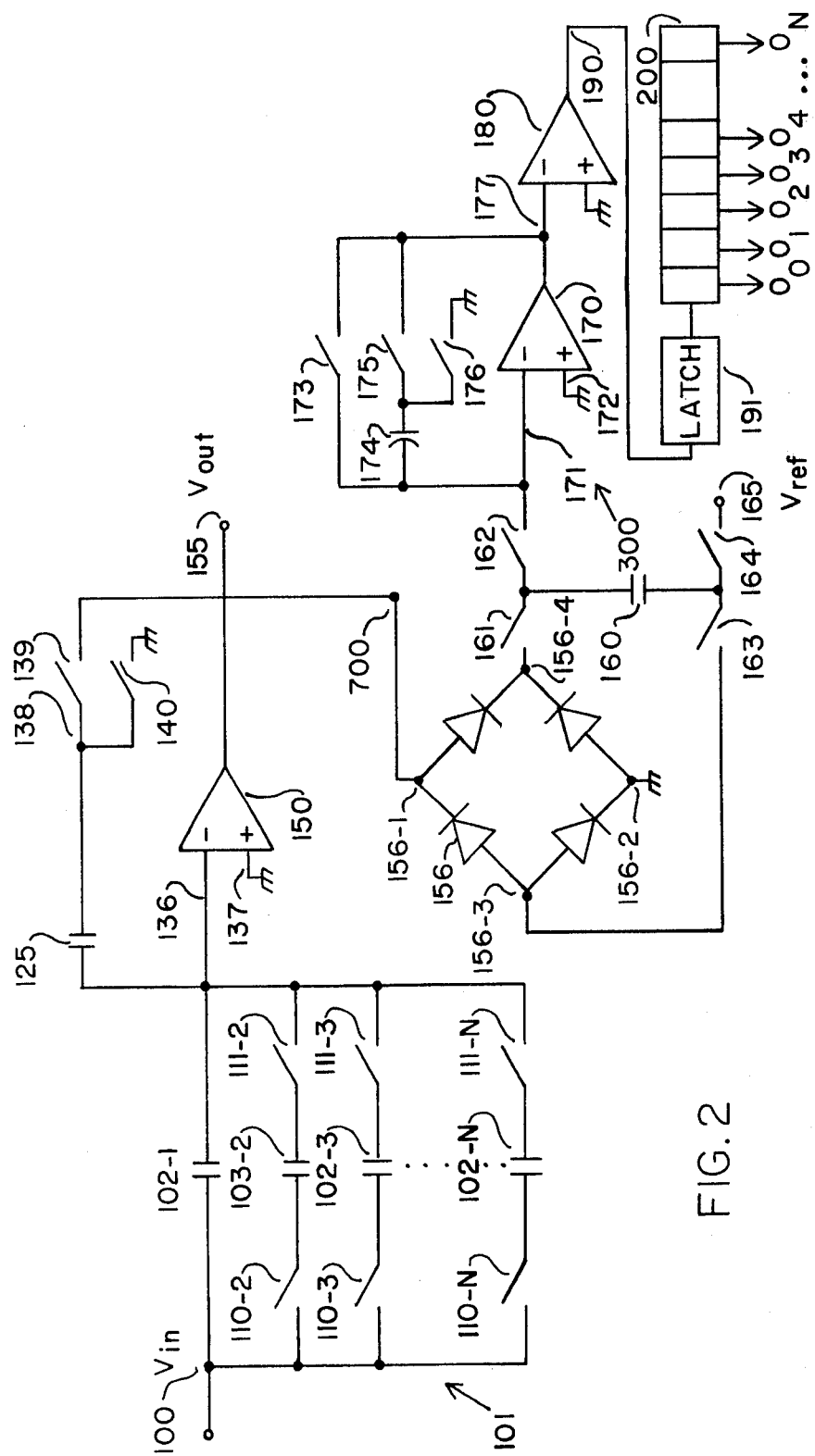
FIG. 2 is a schematic diagram of a second automatic gain control circuit constructed in accordance with this invention.

In another embodiment of this invention, as shown in FIG. 2, the closed loop gain of operational amplifier 150 is determined by the effective capacitance of capacitor array 101, connected between input terminal 100 and inverting input lead 136 of operational amplifier 150, and capacitor 125, connected between inverting input lead 136 and output terminal 155. Capacitor array 101 comprises capacitor 102-1 (having capacitance value $C_1$) and capacitors 102-2 through 102-N which are selectively connected in parallel with capacitor 102-1 by the operation of switches 110-2 through 110-N and 111-2 through 111-N. In the embodiment of this invention shown in FIG. 2, the closed loop gain $G_1$ of operational amplifier 150 is equal to $$G_1 = (-C_{101}/C_{125}) \qquad (6)$$

where
$G_1$ equals a closed loop gain of operational amplifier 150;
$C_{101}$ equals the effective capacitance of capacitor array 101, as determined by the operation of switches 110-2 through 110-N and 111-2 through 111-N; and
$C_{125}$ equals the capacitance of capacitor 125.

The capacitors 102-1 through 102-N and capacitor 101 may utilize any weighting scheme desired, including but not limited to the weighting schemes discussed above for capacitor array 121 of FIG. 1. Thus, capacitors 102-1 through 102-N may be equally weighted, binary weighted, weighted in accordance with the $\mu 255$ law, or weighted in other manners.

As in the operation of capacitor array 121 (FIG. 1), the switches 110-2 through 110-N and 111-2 through 111-N of capacitor array 102 (FIG. 2) are controlled by the output bits $O_2$ through $O_N$ of counter 200. However, because the capacitance of capacitor array 101 forms the numerator of the closed loop gain $G_1$ in the circuit of FIG. 2, as opposed to the capacitance of array 121 forming the denominator of the closed loop gain (equation 1) of the circuit of FIG. 1, the switches of array 101 operate in inverse fashion as the switches of array 121. Thus, when counter 200 increases its count, corresponding to the receipt of a sign bit which is logical 0, corresponding to an output voltage $V_o$ which, when rectified by rectifier means 156, is greater in magnitude than the reference voltage $V_{ref}$, selected capacitors in capacitor array 101 are disconnected from capacitor 102-1 by the operation of switches 110-2 through 110-N and 111-2 through 111-N, thus increasing the ratio of capacitance of capacitor 125 to the capacitance of array 101, thereby decreasing the closed loop gain of operational amplifier 150, thereby decreasing the amplitude of output voltage $V_o$ available on output terminal 155. As the count provided by counter 200 increases in value the effective capacitance of capacitor array 101 decreases. Therefore, it is preferred that the capacitor of capacitor array 101 having the highest capacitance value be controlled by the most significant bit of counter 200, the next largest capacitance value be controlled by the next most significant bit., etc., and the smallest capacitance value of array 101 be controlled by a least significant bit of counter 200. Thus, switch 110-l and 111-l open in response to a bit $O_l$ of counter 200 being a logical one, and close in response to a bit $O_l$ being a logical 0, where L is an integer ranging from 2 to N.

In a similar fashion, when the count stored in counter 200 decreases, corresponding to receipt of a sign bit which is a logical one, corresponding to an output voltage $V_o$ which, when rectified by rectifier means 156, is lower in magnitude than reference voltage $V_{ref}$, selected capacitors of capacitor array 101 are connected in parallel with capacitor 102-1, thus increasing the effective capacitance of capacitor array 101, thus increasing the closed loop gain of operational amplifier 150.

Figure 3:
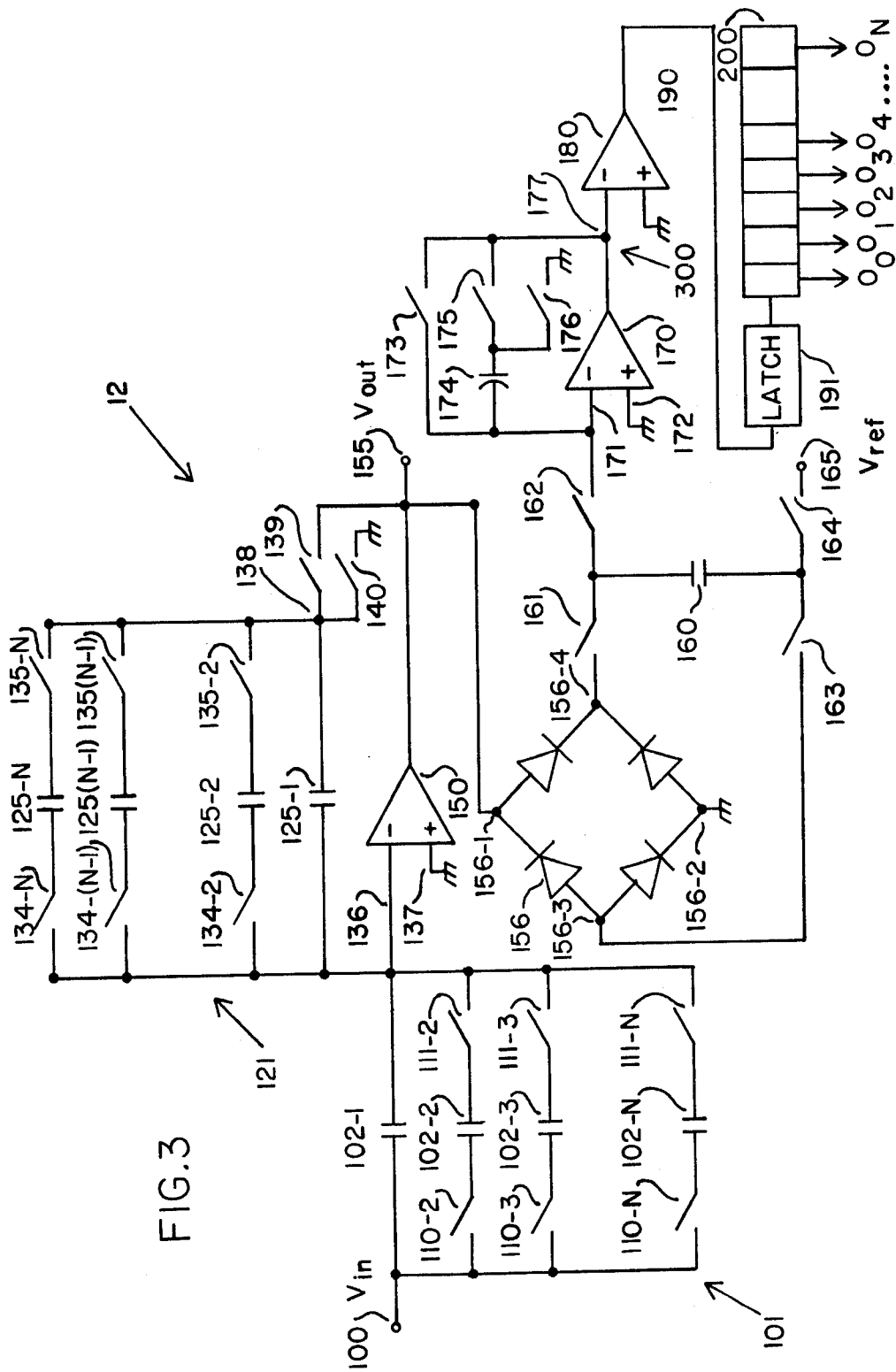
FIG. 3 is a schematic diagram of another automatic gain control circuit constructed in accordance with this invention.

Yet another embodiment of this invention, shown in the schematic diagram of FIG. 3, utilizes capacitor array 121 as in the circuit of FIG. 1, in conjunction with capacitor array 101, as in the circuit of FIG. 2. Because the operation of capacitor arrays 101 and 121 are described above, the description of their operation in the circuit of FIG. 3 will not be repeated here.

In general, the response time of an automatic gain control circuit is defined as the time constant $T_{AGC}$ of the envelope of the output signal of the automatic gain control circuit, as shown in FIG. 4b. FIG. 4a shows an input signal to an automatic gain control circuit. FIG. 4b shows the output signal of the automatic gain control circuit provided in response to the input signal of FIG. 4a. The time constant T of the envelope defines the response time of the automatic gain control circuit. Generally, a response time on the order of tens of microseconds is deemed a "fast" AGC response time, and a response time on the order of hundreds of milliseconds is deemed a "slow" AGC response time.

The response time $T_{AGC}$ of the automatic gain control circuit of this invention is proportional to the time constant $T_{300}$ of integrator circuit 300. The time constant of integrator circuit 300 is defined as $$T_{300} \propto R_{160}C_{174} \qquad (7)$$

where:

$T_{300}$ = The time constant of integrator stage 300 and thus the response time of the AGC circuit of this invention;

$R_{160}$ = The effective resistance of switched capacitor resistor equivalent 160; and $C_{174}$ = The capacitance of capacitor 174.

The use of switched capacitors as resistor equivalents is described, for example, by Caves et al, in an article "Sample Analog Filtering Using Switched Capacitors as Resistor Equivalents", IEEE Journal of Solid-State Circuits, Vol. SC-12, No. 6, December 1977. The effective resistance of a switched capacitor resistor equivalent (capacitor 160) is equal to $$R_{160} = (T_{160}/C_{160}) \qquad (8)$$

where:

$T_{160}$ = The switching rate of switched capacitor 160; and $C_{160}$ = The capacitance of capacitor 160.

From equations (7) and (8), the time constant $T_{300}$ of integrator stage 300 follows the following proportionality:

$$T_{300} \propto ((T_{160} C_{174})/C_{160}) \qquad (9)$$

and $$T_{AGC} \propto ((T_{160} C_{174})/C_{160}) \qquad (10)$$

Thus, the time constant of integrator stage 300, and thus the response time will be AGC circuit of this invention, may be increased by either increasing the switching speed of integrator stage 300, increasing the capacitance of capacitor 174, decreasing the capacitance of capacitor 160, or a combination of these three techniques. By replacing capacitor 160 and capacitor 174 with capacitor arrays (not shown) wherein the effective capacitance of capacitor array 160 and capacitor array 174 may be controlled by switches in a manner similar to the operation of capacitor arrays 101 and 121, the time constant of integrator stage 300, and thus the response time of the AGC circuit of this invention, may be controlled over a wide range, as desired.

The response time of the AGC circuit of this invention may also be adjusted by changing the number of least significant bits of counter 200 which are not used to control the switches of capacitor arrays 121 and 101. However, this technique of controlling the response time of the AGC circuit of this invention is useful primarily to implement small changes in the response time. In order to implement large changes in the response time by altering the number of least significant bits which are not used to control the switches of capacitor arrays 121 and 101, a large number of additional shift register bits, as well as appropriate control logic, must be made available, with an attendant increase in components, surface area, and cost.

While this specification illustrates several embodiments of this invention, it is not to be interpreted as limiting the scope the invention. Many embodiments of this invention are possible to those skilled in the art in accordance with the teachings of this specification. For example, components other than capacitors may be utilized to control the closed loop gain of the AGC circuit of this invention.

I claim:

1. An automatic gain control circuit having an input terminal and an output terminal comprising:

amplifier means having an inverting input lead, a noninverting input lead connected to a reference voltage, and an output lead connected to said terminal output for providing an automatic gain control circuit output;

a first capacitor connected between said input terminal and said inverting input lead of said amplifier means;

means for controlling the gain of said automatic gain control circuit;

means for rectifying the output voltage of said automatic gain control circuit;

means for alternately integrating the rectified output voltage of said automatic gain control circuit and a reference voltage;

a digital counter operating in response to the output signal from said means for integrating;

a plurality of N capacitors, where N is a positive integer; and a plurality of switch means for selectively connecting desired ones of said N capacitors in parallel between said inverting input lead and said output lead of said amplifier means;

wherein said digital counter increases its count in response to an output signal of a first polarity from said integrator, and descreases its count in response to an output signal from said means for integrating of a second polarity opposite said first polarity from said integrator stage, and wherein the plurality of switch means is controlled by the count stored in said counter, and wherein the gain of said automatic gain control circuit is controlled by the ratio of the capacitance of said first capacitor to the capacitance of said selected ones of said plurality of capacitors.

2. An automatic gain control circuit having an input terminal and an output terminal comprising amplifier means having an inverting input lead, a noninverting input lead connected to a reference voltage, and an output lead connected to said output terminal for providing an automatic gain control circuit output signal;

a first capacitor connected between said input terminal and said inverting input lead of said amplifier means;

means for controlling the gain of said amplifier means;

means for rectifying the output voltage of said amplifier means;

means for alternatively integrating the rectified output voltage of said amplifier means and a reference voltage;

a digital counter operating in response to the output signal from said means for integrating;

a plurality of N capacitors, where N is a positive integer; and a plurality of switch means for selectively connecting desired ones of said N capacitors in parallel between said inverting input lead of said amplifier means and said input terminal;

wherein said counter increases its count in response to an output signal of a first polarity from said integrator, and decreases its count in response to an output signal from said integrator stage of a second polarity opposite said first polarity;

wherein said plurality of switch means is controlled by the count stored in said counter;

and wherein the gain of said automatic gain control circuit is controlled by the ratio of the capacitance of said first capacitor to the capacitance of said selected ones of said plurality of capacitors.

3. An automatic gain control circuit as in claim 2 which further comprises:
a second plurality of M capacitors, where M is a positive integer; and
a second plurality of M switch means for selectively connecting desired ones of said M capacitors in parallel between said inverting input lead of said amplifier means and said output lead of said amplifier means;
whereby the gain of said automatic gain control circuit is controlled by the ratio of the capacitance of said selected ones of said plurality of N capacitors to the capacitance of said selected ones of said M capacitors.

4. An automatic gain control circuit as in claim 1 wherein said plurality of switch means are controlled by an equal plurality of bits of the number stored in said counter.

5. An automatic gain control circuit as in claim 2 wherein said plurality of switch means are controlled by an equal plurality of bits of the number stored in said counter.

6. An automatic gain control circuit as in claim 3 wherein said plurality of switch means are controlled by an equal plurality of bits of the number stored in said counter.

7. An automatic gain control circuit as in claim 4 wherein said plurality of capacitors are binary weighted.

8. An automatic gain control circuit as in claim 5 wherein said plurality of capacitors are binary weighted.

9. An automatic gain control circuit as in claim 6 wherein said plurality of capacitors are binary weighted.

10. An automatic gain control circuit as in claim 7 wherein the switch means controlling the connection of the capacitor of said plurality of capacitors having the Jth greatest capacitance, where J is an integer ranging from 1 to N, is controlled by the Jth most significant bit of said digital counter.

11. An automatic gain control circuit as in claim 8 wherein the switch means controlling the connection of the capacitor of said plurality of capacitors having the Jth greatest capacitance where J is an integer ranging from 1 to N, is controlled by the Jth most significant bit of said digital counter.

12. An automatic gain control circuit as in claim 9 wherein the switch means controlling the connection of the capacitor of said plurality of capacitors having the Jth greatest capacitance, where J is an integer ranging from 1 to N, is controlled by the Jth most significant bit of said digital counter.

13. The method of providing from a amplifier means an output signal of relatively constant amplitude comprising the steps of:
rectifying said output signal;
integrating the rectified output signal in an integrator;
generating a bit indicative of the polarity of the signal stored in said integrator;
operating a counter in response to said bit indicative, wherein said counter increases its count in response to a bit indicative of a first polarity and decreases its count in response to a bit indicative of a second polarity opposite said first polarity;
switching a set of capacitors in response to the count stored in said counter thereby adjusting the gain of said amplifier means.

* * * * *